United States Patent
Yamasaki (10) Patent No.: US 11,380,407 B2
(45) Date of Patent: Jul. 5, 2022

(54) MEMORY SYSTEM AND METHOD FOR MEASURING CAPACITANCE VALUE

(71) Applicant: KIOXIA CORPORATION, Tokyo (JP)

(72) Inventor: Hiroki Yamasaki, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/185,434

(22) Filed: Feb. 25, 2021

(65) Prior Publication Data

US 2022/0084604 A1   Mar. 17, 2022

(30) Foreign Application Priority Data

Sep. 16, 2020  (JP) .............................. JP2020-155223

(51) Int. Cl.
*G11C 5/14* (2006.01)
*G11C 16/30* (2006.01)
*G11C 16/04* (2006.01)

(52) U.S. Cl.
CPC .......... *G11C 16/30* (2013.01); *G11C 16/0483* (2013.01)

(58) Field of Classification Search
CPC .................................................... G11C 16/30
See application file for complete search history.

(56) References Cited

U.S. PATENT DOCUMENTS

| 10,298,045 B2 | 5/2019 | Jung et al. |
| 10,416,241 B2 | 9/2019 | Matsumura et al. |
| 2010/0052625 A1* | 3/2010 | Cagno .................. G01R 31/387 320/166 |
| 2012/0224445 A1* | 9/2012 | Hauck .................... G01R 31/64 365/229 |
| 2013/0283069 A1* | 10/2013 | Matsuda ................... G06F 1/26 713/300 |
| 2020/0091737 A1 | 3/2020 | Hallstrom et al. |
| 2021/0231720 A1* | 7/2021 | Butler .............. G11C 29/12005 |

* cited by examiner

*Primary Examiner* — Min Huang
(74) *Attorney, Agent, or Firm* — Kim & Stewart LLP (57) ABSTRACT

According to one or more embodiments, a memory system includes a nonvolatile semiconductor memory, a capacitor, a constant current circuit, a measurement circuit, and a controller. The capacitor stores charges to be supplied to the nonvolatile semiconductor memory. The constant current circuit extracts the charge from the capacitor at a constant current. The measurement circuit measures a terminal voltage of the capacitor. The controller controls the nonvolatile semiconductor memory. The controller calculates a capacitance value of the capacitor based both on a resistance value of a leakage resistance of the capacitor and a change in the measured terminal voltage over time in each of a first period during which the capacitor naturally discharges and a second period during which the constant current circuit extracts the charge from the capacitor.

20 Claims, 9 Drawing Sheets

MEMORY SYSTEM AND METHOD FOR MEASURING CAPACITANCE VALUE

CROSS-REFERENCE TO RELATED APPLICATION(S)

This application is based upon and claims the benefit of priority from Japanese Patent Application No. 2020-155223, filed Sep. 16, 2020, the entire contents of which are incorporated herein by reference.

FIELD

Embodiments described herein relate generally to a memory system and a method for measuring a capacitance value.

BACKGROUND

A solid-state drive (SSD) and the like are often used as a non-volatile memory system. In such a memory system, various capacitors for various purposes are incorporated. The capacitance value of a capacitor for a specific application, from among all the various capacitors, needs to be monitored with high accuracy.

Hence, there is a need for a memory system capable of measuring and monitoring the capacitance value of an incorporated capacitor with high accuracy and a method for measuring the capacitance value of such a capacitor in a memory system with high accuracy.

DETAILED DESCRIPTION

According to one or more embodiments, a memory system includes a nonvolatile semiconductor memory, a capacitor, a constant current circuit, a measurement circuit, and a controller. The capacitor stores charge to be supplied to the nonvolatile semiconductor memory. The constant current circuit extracts the charge from the capacitor at a constant current. The measurement circuit measures a terminal voltage at of the capacitor. The controller controls the nonvolatile semiconductor memory and calculates a capacitance value of the capacitor based on a resistance value of a leakage resistance through which a leakage current of the capacitor flows and a change in the measured terminal voltage over time in each of a first period during which the capacitor naturally discharges and a second period during which the constant current circuit extracts the charge from the capacitor.

Hereinafter, certain example embodiments will be described with reference to the accompanying drawings. In the drawings, components that are substantially the same are denoted by the same reference numerals, and description thereof may be omitted with respect to subsequent drawings.

First Embodiment

Figure 1:
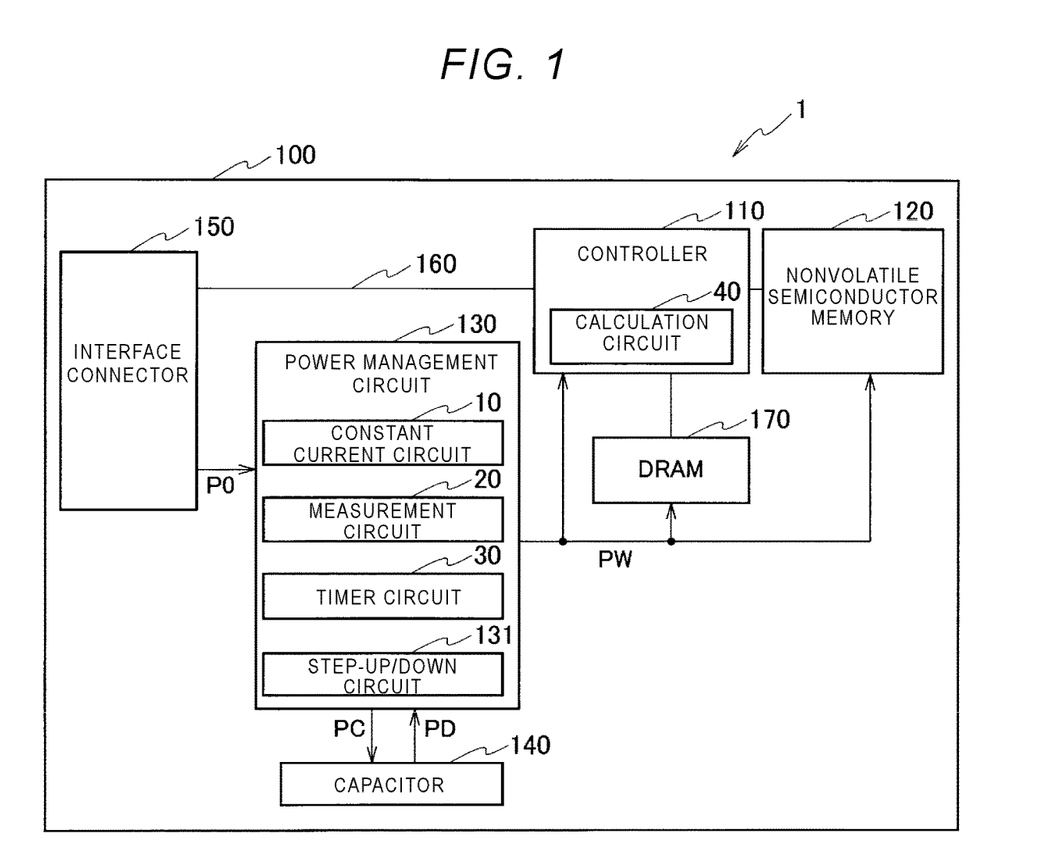
FIG. 1 depicts an example configuration of a memory system in a schematic view according to a first embodiment.

As shown in FIG. 1, a memory system 1 according to a first embodiment includes a substrate 100. A controller 110, a nonvolatile semiconductor memory 120, a power management circuit 130, a capacitor 140, an interface connector 150, and a Dynamic Random-Access Memory (DRAM) 170 are mounted on the substrate 100. The memory system 1 is, for example, a Solid-State Drive (SSD) or a Universal Flash Storage (UFS) device.

The controller 110 may include a circuit such as a System-on-a-Chip (SoC). The controller 110 controls operations of the memory system 1. In general, each described function of the controller 110 may be implemented by the controller 110 executing firmware or the like. Likewise, each function of the controller 110 may be implemented by dedicated hardware in the controller 110. The nonvolatile semiconductor memory 120 is, for example, a NAND flash memory.

The memory system 1 is connected to a host device (not separately depicted) via the interface connector 150. The interface connector 150 is connected to the controller 110 via a bus 160. Data is transferred between the host device and the controller 110 via the interface connector 150 and the bus 160.

The controller 110 controls communication between the host device and the memory system 1. For example, the controller 110 receives a command from the host device and controls the nonvolatile semiconductor memory 120, while using the DRAM 170, to execute a write operation and a read operation according to a command from the host device or the like. The controller 110 may also control the nonvolatile semiconductor memory 120, while using the DRAM 170, to execute an erase operation for erasing stored data. The write operation, the read operation, and the erase operation executed by the nonvolatile semiconductor memory 120 may be collectively referred to as an "operation of the nonvolatile semiconductor memory 120".

The power management circuit 130 controls supply of power to the nonvolatile semiconductor memory 120 and the controller 110. The power management circuit 130 also controls charging and discharging of the capacitor 140. The capacitor 140 is used to supply power to the memory system 1 for a power loss protection (PLP) process for protecting the memory system 1 when power supplied from an external device to the memory system 1 is insufficient or lost (cutoff). During the PLP process, under control of the power management circuit 130, power corresponding to the amount of charge stored in the capacitor 140 is supplied to electronic components, such as the controller 110 and the nonvolatile semiconductor memory 120, mounted on the substrate 100. Examples of the capacitor 140 includes, but is not limited to, an electrolytic capacitor, a multilayer capacitor, a tantalum capacitor, an electric double layer capacitor, a polymer capacitor, and a battery.

The power management circuit 130 includes a constant current circuit 10, a measurement circuit 20, a timer circuit 30, and a step-up/down circuit 131. The controller 110 includes a calculation circuit 40. Functions of the calculation circuit 40 may be implemented by the controller 110 executing a program or programs stored in, for example, the nonvolatile semiconductor memory 120.

The constant current circuit 10 extracts charge from the capacitor 140 with a constant current. The charge extraction is done by, for example, extracting electrons with a constant current or with a constant charge amount per unit time or by reducing a stored charge amount. The measurement circuit 20 measures a voltage (may also be referred to as a terminal voltage herein) between terminals at both ends of the capacitor 140. The timer circuit 30 measures various time while the measurement circuit 20 measures the terminal voltage of the capacitor 140. The calculation circuit 40 calculates a capacitance value of the capacitor 140 by using a formula including at least a resistance value, as a variable, of a leakage resistance, such as a resistance through which a leakage current of the capacitor 140 flows.

The DRAM 170 is used to store management information that is used for controlling the operations of the nonvolatile semiconductor memory 120 and cache data transmitted from and to the host device. For example, the controller 110 uses the DRAM 170 to temporarily store data transmitted from the host device to be stored in the nonvolatile semiconductor memory 120. Further, the controller 110 uses the DRAM 170 to temporarily store data read from the nonvolatile semiconductor memory 120 and transmitted to the host device.

When the memory system 1 is started up, or when the controller 110 receives a read command or a write command from the host device, or the like, a part or all of the management information stored in the nonvolatile semiconductor memory 120 is loaded or cached in the DRAM 170. The controller 110 updates the management information loaded in the DRAM 170 and backs up the management information to the nonvolatile semiconductor memory 120 at a particular timing. This management information includes, for example, a look up table (LUT), which is a correspondence table for referring to a data storage position of the nonvolatile semiconductor memory 120.

External power P0 is supplied from an outside of the memory system 1 to the power management circuit 130 via the interface connector 150. The power management circuit 130 controls on/off of supply of power PW to the controller 110, the nonvolatile semiconductor memory 120, and the DRAM 170 according to the operation of the memory system 1. The power management circuit 130 is formed as an integrated circuit. The power management circuit 130 may be a power management IC (PMIC). The external power P0 and the power PW are supplied as voltages capable of passing a limited current.

The power management circuit 130 controls charging and discharging of the capacitor 140. The power management circuit 130 charges the capacitor 140 with power PC. In order to increase energy corresponding to a charge amount stored in the capacitor 140, the power management circuit 130 may step up a voltage of the supplied external power P0 and charge the capacitor 140 with the stepped-up voltage. The power management circuit 130 steps up the voltage of the external power P0 by the step-up/down circuit 131.

When the power of the memory system 1 is insufficient or lost, the power management circuit 130 supplies the charge stored in the capacitor 140 to the controller 110, the nonvolatile semiconductor memory 120, and the DRAM 170. For example, in a case where the external power P0 is insufficient to an extent that the power management circuit 130 cannot supply the power PW that the memory system 1 requires to operate normally to the controller 110, the nonvolatile semiconductor memory 120, and the like, the power management circuit 130 uses the charge stored in the capacitor 140.

The power management circuit 130 monitors the external power P0 during the operation of the memory system 1 and discharges the capacitor 140 when the power is insufficient or lost. As a result, the charge accumulated in the capacitor 140 is supplied to the nonvolatile semiconductor memory 120 and the controller 110 via the power management circuit 130. At this time, if the voltage of the external power P0 has been stepped-up to charge the capacitor 140, the power management circuit 130 steps down a voltage corresponding to power PD supplied by the capacitor 140 to a certain voltage by the step-up/down circuit 131. Then, the power management circuit 130 supplies the power PW corresponding to the stepped-down voltage to the controller 110 and the nonvolatile semiconductor memory 120.

During a period in which the memory system 1 is operated by the charge supplied by the capacitor 140, the memory system 1 executes a power-off operation similar to that in a normal shutdown. For example, under the control of the controller 110, an operation of writing contents of a cache buffer stored in the DRAM 170 to the nonvolatile semiconductor memory 120 is executed, and the management information, such as the LUT, stored in the nonvolatile semiconductor memory 120 is updated. Accordingly, in the present embodiment, the memory system 1 including the capacitor 140 executes a particular operation for shutting down the power even during an unintended shutdown due to the loss or insufficiency of the power. As a result, the data to be stored in the nonvolatile semiconductor memory 120 is protected.

In order to guarantee high data reliability, the capacitor 140 may have large capacity (or high capacitance) for the PLP process such that data can be protected when the power is lost or insufficient. For example, when the power supplied to the memory system 1 is suddenly lost due to a power failure or the like, or when the supplied power is momentarily cut off due to disconnection or poor contact, a back-up operation that saves all the data to be stored without losing the data can be performed using the large-capacity capacitor 140. Therefore, the power for the back-up operation is stored in the capacitor 140. Since the writing operation in the nonvolatile semiconductor memory 120 requires a very large amount of energy, the energy corresponding to the charge amount stored in the capacitor 140 is preferably large enough in capacity to store charge sufficient for writing operations in the nonvolatile semiconductor memory 120.

However, the storage capacity of a capacitor having a large capacitance value is likely to decrease due to age deterioration. If a capacitance value of the capacitor 140 decreases significantly due to the age deterioration, the stored energy may become insufficient for the back-up operation, and the back-up operation cannot be guaranteed to occur.

Therefore, in the present embodiment, the memory system 1 periodically measures the capacitance value of the capacitor 140 to monitor the present capacitance value of the capacitor 140. If the capacitance value of the capacitor 140 becomes lower than a certain value, the memory system 1 shifts to a mode of stopping a new writing operation. A period until the capacitance value of the capacitor 140 drops to the certain value may be regarded as the effective product life of the memory system 1. The certain value for the capacitance value of the capacitor 140 is set in advance according to the power required to enable the back-up operation of the memory system 1.

The time duration (product lifetime) during which the memory system 1 can be used is determined based on the measured capacitance value of the capacitor 140. Therefore, accuracy in measuring the capacitance value of the capacitor 140 is preferably high.

Figure 2:
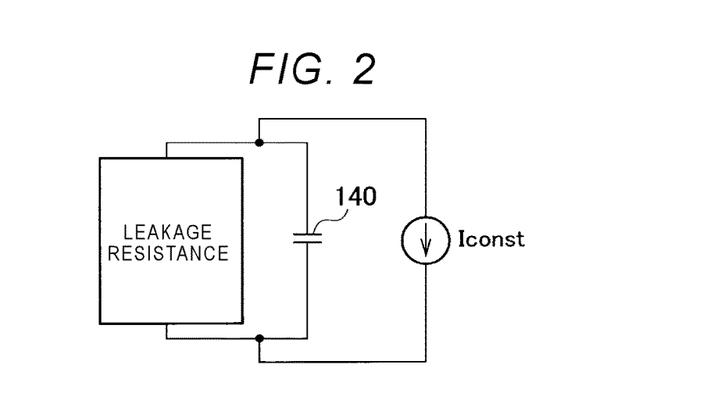
FIG. 2 depicts a schematic circuit diagram related to a method for measuring a capacitance value of a capacitor.

The capacitance value of the capacitor 140 can be measured by constant current measurement in which charges are extracted from the capacitor 140 at a constant current. In order to accurately measure the capacitance value of the capacitor 140, it is necessary to consider the leakage current of the capacitor 140. The electrical resistance of a path through which the leakage current of the capacitor 140 must flow is also referred to as a "leakage resistance". The leakage resistance also includes the resistance of a circuit connected to a terminal of the capacitor 140, and the like. FIG. 2 depicts a schematic circuit for measuring the capacitance value of the capacitor 140. As shown in FIG. 2, a constant current source is connected between one connection point and another connection point of parallel connection of the leakage resistance and the capacitor 140. The constant current source extracts the stored charge from the capacitor 140 at a constant current Iconst. Based on such a circuit configuration, the capacitance value of the capacitor 140 can be accurately measured. The capacitance value Ctotal of the capacitor 140 is calculated by using the following Equation (1):

$$Ctotal = -dt/\{Rleak \times \ln(1 - dV/(V0 + Rleak \times Iconst))\}$$

In Equation (1), Rleak is the resistance value of the leakage resistance, and Iconst is a value of the constant current that extracts the charge from the capacitor 140. Further, value V0 is the terminal voltage of the capacitor 140 at the start of measurement, dt is a measurement time of the terminal voltage, and dV is a variation of the terminal voltage corresponding to the measurement time dt.

In a case of Rleak×Iconst≫V0, dV, Taylor expansion of Equation (1) provides Equation (2):

$$Ctotal = (Iconst + V0/Rleak) \times (dt/dV)$$

Here, when the influence of the leakage current is not taken into consideration, the capacitance value Ctotal of the capacitor 140 can be calculated by using the following $$Ctotal = Iconst \times (dt/dV) \quad \text{Equation (3):}$$

However, the product life of the memory system 1 may be estimated to be shorter than the actual product life based on a capacitance value Ctotal calculated without considering the influence of the leakage current.

Thus, according to the memory system 1 of the present embodiment, the capacitance value of the capacitor 140 can be more accurately measured by considering the leakage current.

Measuring the capacitance value of the capacitor 140 as performed by the memory system 1 according to the present embodiment is a combination of measurements during a first period in which the capacitor 140 naturally discharges and during a second period in which the capacitor charge is extracted from the capacitor 140 at a constant current.

Figure 3:
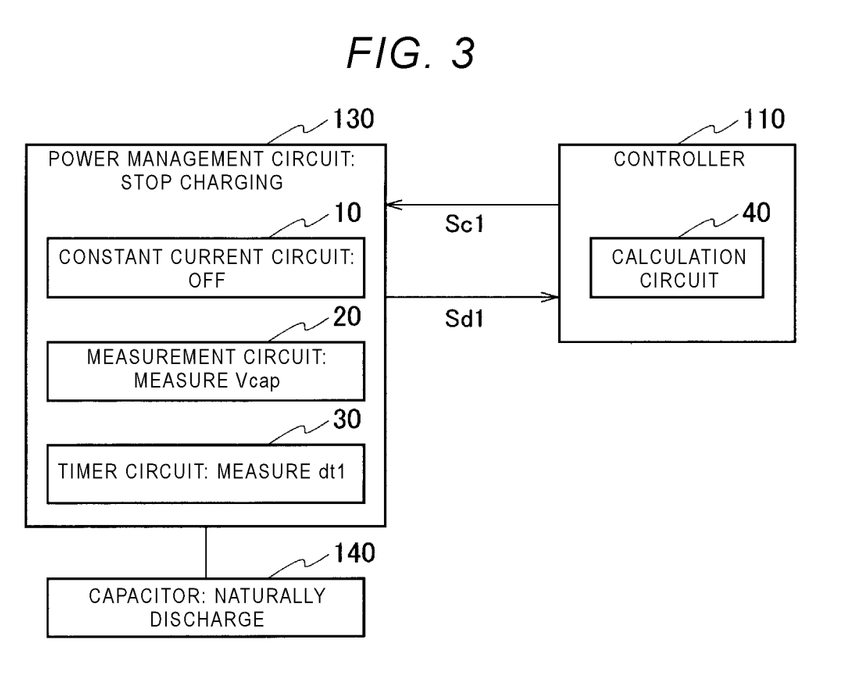
FIG. 3 is a block diagram depicting aspects related to a natural discharge measurement performed by a memory system according to a first embodiment.
Figure 4:
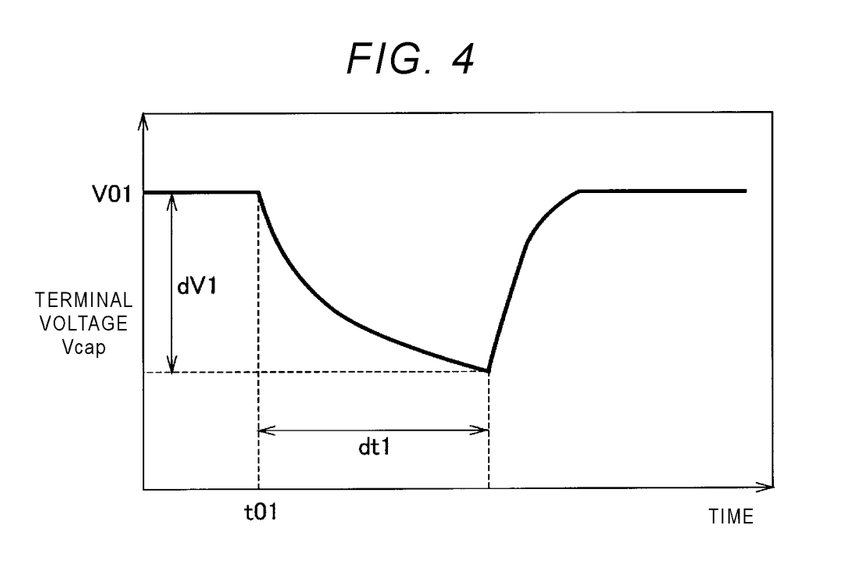
FIG. 4 depicts an example of a terminal voltage change of a capacitor in a natural discharge measurement according to a first embodiment.

Herein, the measurement in the first period may also be referred to as natural discharge measurement or a first measurement. FIG. 3 depicts an example configuration of the memory system 1 performing the natural discharge measurement. FIG. 4 depicts an example change of the terminal voltage of the capacitor 140 over time in the natural discharge measurement. In the first period, the change of the terminal voltage of the capacitor 140 is measured over time while the capacitor 140 naturally discharges.

The natural discharge measurement is started by the controller 110 transmitting a control signal Sc1 that instructs the natural discharge measurement to the power management circuit 130. The power management circuit 130 that has received the control signal Sc1 starts the natural discharge measurement with the charging of the capacitor 140 stopped. During the natural discharge measurement, the operation of the constant current circuit 10 is off.

In the natural discharge measurement, as shown in FIG. 4, a terminal voltage Vcap of the capacitor 140 gradually drops with the elapse of time. During this period, the change of the terminal voltage Vcap is not linear due to the influence of the leakage current flowing through the leakage resistance. Specifically, immediately after the start of natural discharging, the voltage drop per unit time is large, but this slows with time.

The measurement circuit 20 measures the terminal voltage Vcap until the voltage V01 at a start time t01 drops by a preset first differential voltage dV1. The timer circuit 30 measures a first elapsed time dt1 from the start time t01 to when the terminal voltage Vcap drops by the first differential voltage dV1. The power management circuit 130 outputs a data signal Sd1 (see FIG. 3) including the first differential voltage dV1 and the first elapsed time dt1 to the calculation circuit 40.

Figure 5:
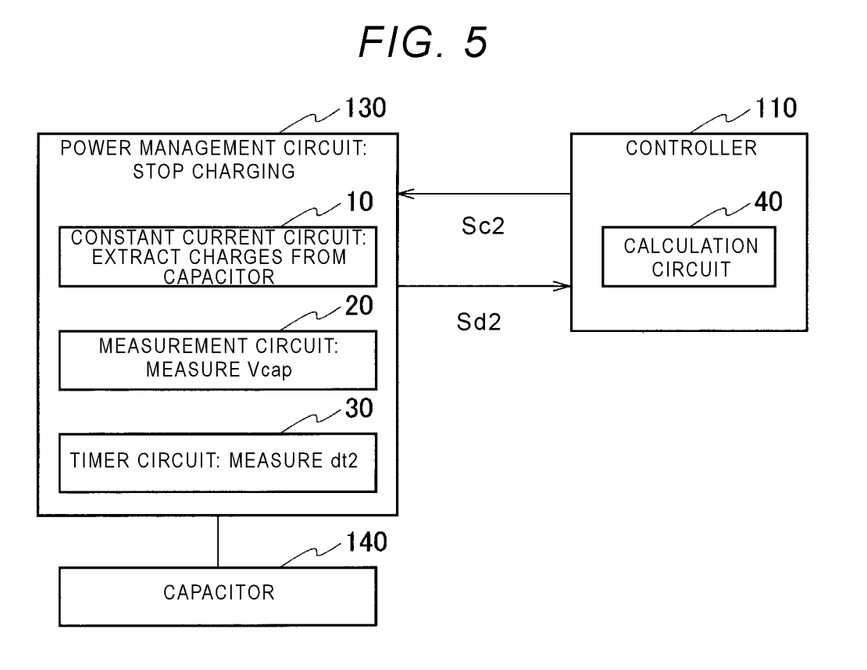
FIG. 5 is a block diagram depicting aspects related to a constant current measurement performed by a memory system according to a first embodiment.
Figure 6:
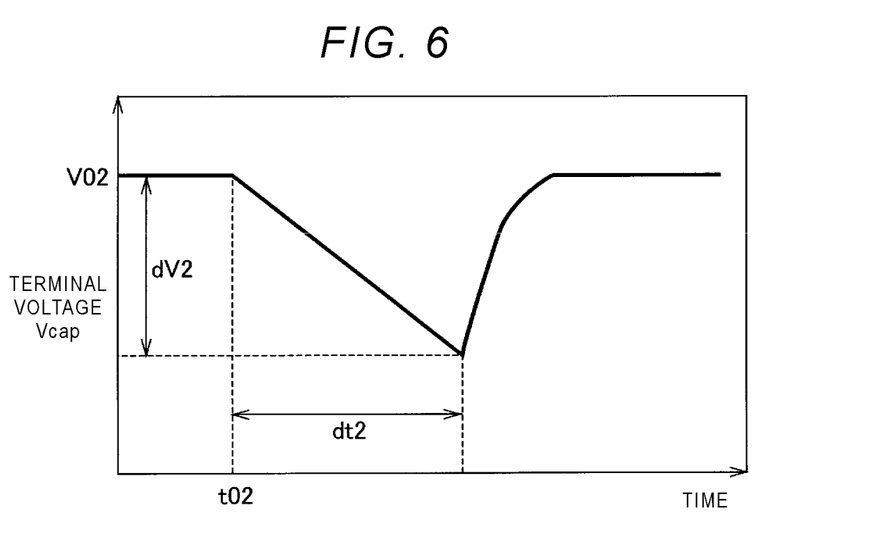
FIG. 6 depicts an example of a terminal voltage change of a capacitor in a constant current measurement according to a first embodiment.

Herein, the measurement in the second period may also be referred to as constant current measurement or a second measurement. FIG. 5 depicts an example configuration of the memory system 1 performing the constant current measurement. FIG. 6 depicts an example change of the terminal voltage of the capacitor 140 in the constant current measurement. In the second period, the change of the terminal voltage of the capacitor 140 is measured over time while the capacitor charge is extracted from the capacitor 140 at a constant current.

The constant current measurement is started by the controller 110 transmitting a control signal Sc2 that instructs the constant current measurement to the power management circuit 130. The power management circuit 130 that has received the control signal Sc2 starts the constant current measurement with the charging of the capacitor 140 stopped. Specifically, the measurement circuit 20 measures the terminal voltage Vcap of the capacitor 140 while the constant current circuit 10 extracts charge from the capacitor 140 at the constant current.

As shown in FIG. 6, the measurement circuit 20 measures the terminal voltage Vcap until the voltage V02 at a start time t02 of the constant current measurement drops by a preset second differential voltage dV2. The timer circuit 30 measures a second elapsed time dt2 from the start time t02 to when the terminal voltage Vcap drops by the second differential voltage dV2. The power management circuit 130 outputs a data signal Sd2 (see FIG. 5) including the second differential voltage dV2 and the second elapsed time dt2 to the calculation circuit 40.

The calculation circuit 40 calculates the resistance value of the leakage resistance and the capacitance value of the capacitor 140 by using the first differential voltage dV1, the first elapsed time dt1, the second differential voltage dV2, and the second elapsed time dt2. Details of a calculation method will be described below.

Figure 7:
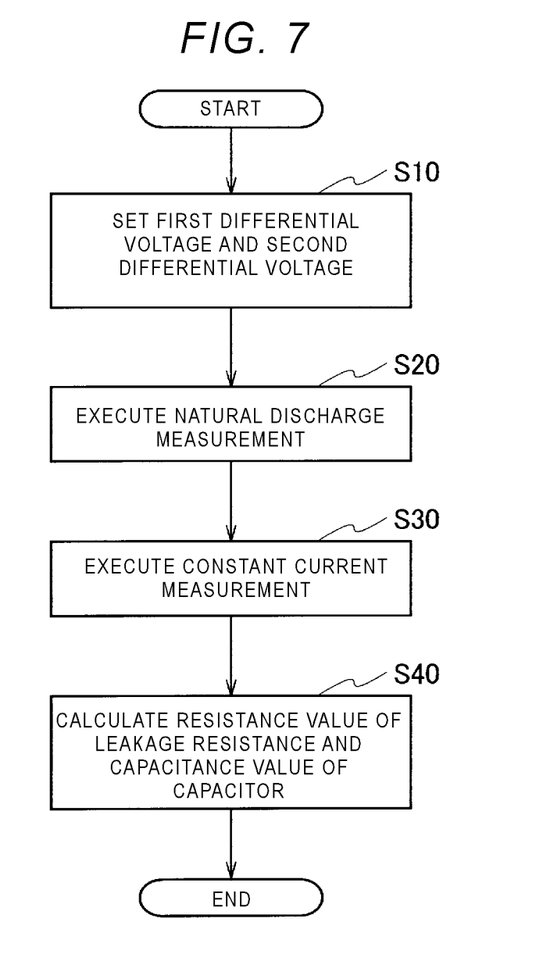
FIG. 7 is a flowchart of a measurement method according to a first embodiment.

Next, a method for measuring the capacitance value of the capacitor 140 in the memory system 1 will be described with reference to a flowchart of FIG. 7.

In S10, the controller 110 sets the first differential voltage dV1 and the second differential voltage dV2. For example, the controller 110 sets these values for the first measurement and the second measurement continuously.

In S20, the controller 110 transmits the control signal Sc1 to the power management circuit 130. As a result, the memory system 1 executes the natural discharge measurement. In the natural discharge measurement, as shown in FIGS. 3 and 4, the first elapsed time dt1 corresponding to the first differential voltage dV1 is measured. The first differential voltage dV1 and the first elapsed time dt1 are output to the calculation circuit 40.

In S30, the controller 110 transmits the control signal Sc2 to the power management circuit 130. As a result, the memory system 1 executes the constant current measurement. In the constant current measurement, as shown in FIGS. 5 and 6, the second elapsed time dt2 corresponding to the second differential voltage dV2 is measured. The second differential voltage dV2 and the second elapsed time dt2 are output to the calculation circuit 40.

In S40, the calculation circuit 40 calculates both the capacitance value of the capacitor 140 and the resistance value of the leakage resistance that is connected to the capacitor 140 by using the first differential voltage dV1, the second differential voltage dV2, the first elapsed time dt1, and the second elapsed time dt2. For example, the calculation circuit 40 calculates the resistance value Rleak of the leakage resistance and the capacitance value Ctotal of the capacitor 140 by using relational expressions of the following:

$$Rleak = -dt1 \times dV2/\{Iconst \times dt2 \times \ln(1-dV1/V0)\} - (V0-dV1)/Iconst \qquad \text{Equation (4):}$$

$$Ctotal = -dt1/\{Rleak \times \ln(1-dV1/V0)\} \qquad \text{Equation (5):}$$

In Equations (4) and (5), the value V0 is the terminal voltage of the capacitor 140 at the start of measurement.

Figure 8:
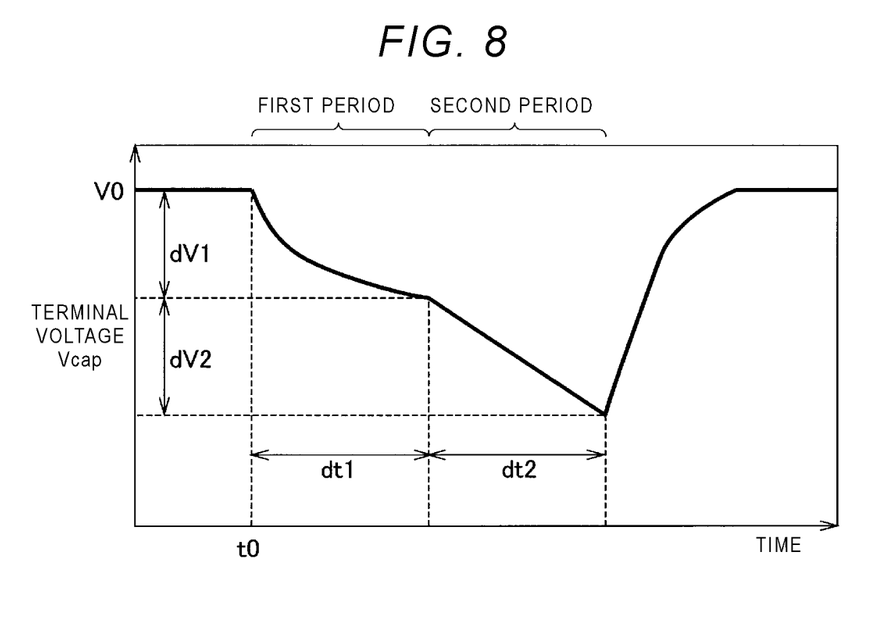
FIG. 8 depicts an example setting of first and second periods according to a first embodiment.

FIG. 8 depicts an example setting of first and second periods. As shown in FIG. 8, the controller 110 measures the first period and the second period back-to-back, as such the constant current measurement starts from a state in which the natural discharge measurement has just completed. An initial voltage of the constant current measurement is the voltage (V0–dV1) which reflects the drop by the first differential voltage dV1 from the initial voltage V0 at the start time t0 of the natural discharge measurement.

Accordingly, the calculation circuit 40 calculates the capacitance value of the capacitor 140 based on the change of the terminal voltage Vcap of the capacitor 140 over time in each of the first period and the second period. In the present embodiment, the resistance value Rleak of the leakage resistance is taken into consideration. Therefore, the capacitance value Ctotal of the capacitor 140 can be accurately measured.

Equations (4) and (5) can be obtained by solving and manipulating simultaneous equations obtained for the constant current measurement (Equation (6)) and for the natural discharge measurement (Equation (7)).

$$Ctotal = (Iconst + (V0-dV1)/Rleak) \times dt2/dV2 \qquad \text{Equation (6):}$$

$$Rleak = -dt1/\{Ctotal \times \ln(1-dV1/V0)\} \qquad \text{Equation (7):}$$

In Equations (6) and (7), V0 is the terminal voltage of the capacitor 140 at the start of measurement, dt1 is the first elapsed time, dt2 is the second elapsed time, and dV1 and dV2 are the changes in the terminal voltage corresponding to the first elapsed time dt1 and the second elapsed time dt2, respectively.

By solving the following simultaneous equations, the resistance value Rleak of the leakage resistance and the capacitance value Ctotal of the capacitor 140 can be calculated more accurately:

$$Ctotal = -dt2/(Rleak \times \ln\{1-dV2/(V0-dV1+Rleak \times Iconst)\})$$

$$Ctotal = -dt1/(Rleak \times \ln\{1-dV1/V0\})$$

When the above equations are solved, the following equations are obtained:

$$Rleak = dV2/(Iconst \times \{1-(1-dV1/V0)^{dt2/dt1}\}) - (V0-dV1)/Iconst$$

$$Ctotal = -dt1/(Rleak \times \ln\{1-dV1/V0\})$$

The capacitor 140 may comprise a plurality of parallel-connected capacitors. In such a case, the capacitance value Ctotal is a sum of capacitance values of the capacitors 140 including the plurality of capacitors.

The capacitor 140 may be, for example, a stacked ceramic capacitor or an aluminum capacitor. Alternatively, in order to miniaturize the memory system 1, the capacitor 140 may be a tantalum capacitor.

The resistance value Rleak calculated in the memory system 1 is a combination of the resistance values of all the leakage resistances connected to the capacitor 140. For example, the leakage resistance includes not only a leakage resistance related to the leakage current flowing through the capacitor 140 itself, but also a leakage resistance related to a leakage current flowing through circuit elements connected in series or in parallel with the capacitor 140.

Lengths of the first and second periods for the respective first and second measurements can be arbitrarily set. For example, typically, the longer the first period or the second period is, the greater the measurement accuracy becomes. On the other hand, since the other operations of the nonvolatile semiconductor memory 120 are stopped while the capacitance value of the capacitor 140 is being measured, the shorter the first and second periods are, the shorter the stop time of the nonvolatile semiconductor memory 120 is.

Therefore, there is a trade-off relationship between the measurement accuracy and the stop time of the nonvolatile semiconductor memory 120. In one instance, in order to measure the capacitance value more accurately, the first and second periods are set to be long. In another instance, in order to shorten the stop time of the nonvolatile semiconductor memory 120, the first and second periods are set to be short.

In some examples, the order of the first period and the second period may be reversed. That is, the second period may be first in time, and the first period may be second in time.

A measurement method of a comparative example measures the capacitance value of the capacitor 140 but ignores the influence of the leakage current of the capacitor 140. In the measurement method of the comparative example, the capacitance value of the capacitor 140 is measured by just the constant current measurement.

Figure 9:
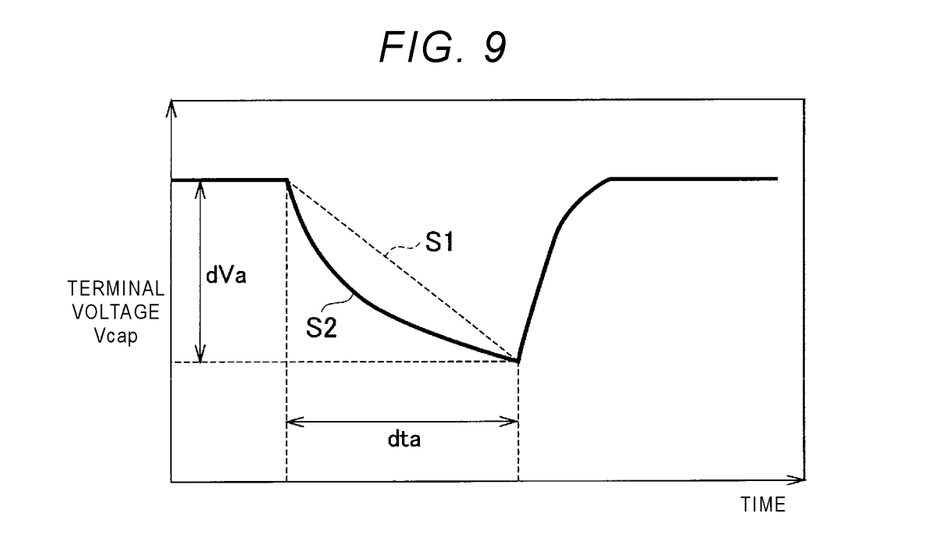
FIG. 9 depicts a terminal voltage change of a capacitor in a measurement method of a comparative example.

FIG. 9 shows an example change of the terminal voltage Vcap in a comparative case where the capacitance value of the capacitor 140 is measured by the constant current measurement and the influence of the leakage current of the capacitor 140 is not taken into account. If no leakage current is generated in the constant current measurement of the capacitance value of the capacitor 140, then change of the terminal voltage Vcap will be linear as shown by a broken line S1 in FIG. 9. In the comparative case, the capacitance value Ctotal is calculated by ignoring the influence of the leakage current in Equation (2). That is, the capacitance value Ctotal is calculated by the following Equation (8) using a variation dVa of the terminal voltage Vcap that changes during the measurement time dta.

$$Ctotal = Iconst \times dta/dVa \qquad \text{Equation (8):}$$

However, since the leakage current of the capacitor 140 is in fact actually generated, the change of the terminal voltage Vcap is not linear as shown by a solid line S2 in FIG. 9. Therefore, in the comparative case, when the leakage current is large, the capacitance value Ctotal of the capacitor 140 is measured to be smaller than the actual value. This leads to a predicted product life of the memory system 1 being shorter than an actual achievable product life in the comparative case when the change of the terminal voltage Vcap is as indicated by S2.

As described above, in the measurement method of the comparative example since the capacitance value Ctotal is calculated without considering the leakage current of the capacitor 140, the capacitance value Ctotal is calculated to be smaller than the actual value. Therefore, when the capacitance value of the capacitor 140 is calculated in the comparative example, the product life of the memory system 1 set in the comparative case is shorter than that the case where the leakage current is considered in the capacitance value measurement such as in the method described with reference to FIGS. 7 and 8. That is, when the capacitance value of the capacitor 140 is measured without considering the leakage current, the period in which the memory system 1 is usable may be shorter than the period in which the memory system 1 could actually be used.

According to the first embodiment, the capacitance value of the capacitor 140 can be accurately measured by combining the natural discharge measurement and the constant current measurement. Therefore, according to the memory system 1, the product life of the memory system 1 can be predicted with higher accuracy and will generally be longer than would otherwise be the case when methods of calculating the capacitance value of the capacitor 140 ignoring the leakage current are utilized. For instance, as the number of capacitors 140 mounted on the memory system 1 increases, the predicted product life becomes longer than that predicted in the comparative case which does not take into account the leakage resistance or the leakage current in the capacitance measurement. This results in the memory system 1 being used for a longer period.

It is also important to predict the occurrence of a short-circuit defect between the terminals of the capacitor 140 by detecting a decrease in the leakage resistance of the capacitor 140 and the like. This is because when the short-circuit defect occurs between the terminals of the capacitor 140, the capacitor 140 cannot be charged at all. When the short-circuit defect of the capacitor 140 occurs during the operation of the memory system 1, the charges in the capacitor 140 are discharged all at once and the memory system 1 may be severely damaged due to heat generation. For example, when a tantalum capacitor is used for the capacitor 140, there are many potential short-circuit defects in the failure mode of a tantalum capacitor.

Furthermore, when the leakage resistance of the capacitor 140 becomes small, the capacitor 140 may not be sufficiently charged due to a high leakage current. When the capacitor 140 cannot be sufficiently charged, the back-up operation of the memory system 1 cannot be guaranteed when the power is lost. Therefore, the data stored in the nonvolatile semiconductor memory 120 may be lost, or the memory system 1 may fail.

According to the first embodiment, the resistance value of the leakage resistance connected to the capacitor 140 can be calculated accurately. Therefore, any drop in the leakage resistance can be detected at an early stage, and an unexpected failure of the memory system 1 due to an increase in the leakage current or a short-circuit defect can be prevented.

Modified Embodiments

Figure 10:
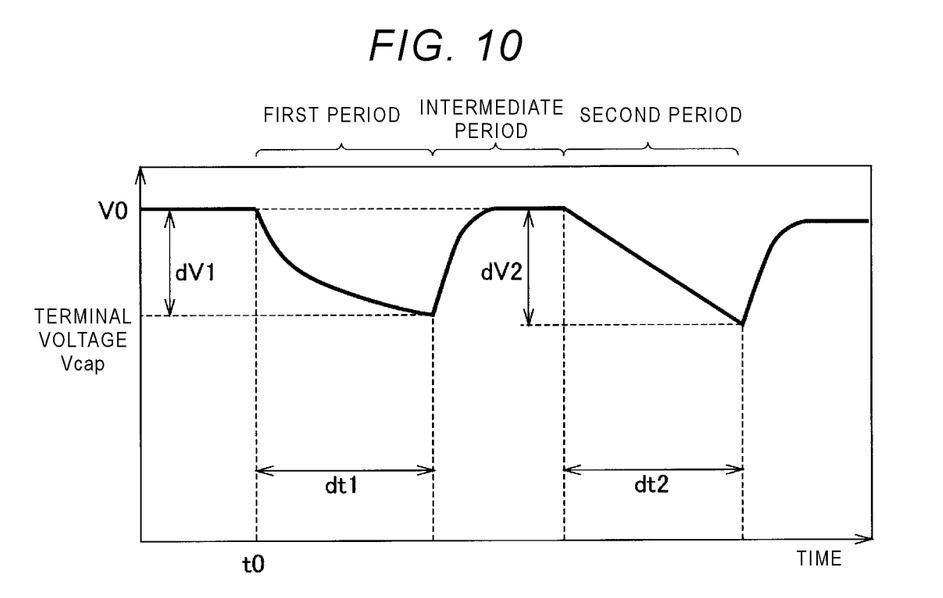
FIG. 10 depicts another example setting of first and second periods according to a first embodiment.

FIG. 8 shows a case in which the first period and the second period are set back-to-back. However, as shown in FIG. 10, in other examples, there may be an interval between the first period and the second period. Even when an intermediate period is set between the first period and the second period, as shown in FIG. 10, the measurements in the first period and the second period are otherwise similar to the measurement method described with reference to FIG. 7.

That is, in the natural discharge measurement, the first elapsed time dt1 corresponding to the first differential voltage dV1 is measured. In the constant current measurement during the second period, the second elapsed time dt2 corresponding to the second differential voltage dV2 is measured. The first differential voltage dV1, the first elapsed time dt1, the second differential voltage dV2, and the second elapsed time dt2 are output to the calculation circuit 40 (see FIGS. 3 and 5). The calculation circuit 40 calculates the capacitance value Ctotal of the capacitor 140 and the resistance value Rleak of the leakage resistance by using relational expressions of the following:

$$Rleak = -dt1 \times dV2/\{Iconst \times dt2 \times \ln(1-dV1/V0)\} - V0/Iconst \qquad \text{Equation (9):}$$

$$Ctotal = -dt1/\{Rleak \times \ln(1-dV1/V0)\} \qquad \text{Equation (10):}$$

As shown in FIG. 10, the power management circuit 130 charges the capacitor 140 between the first period and the second period so that the terminal voltage Vcap returns to the initial voltage V0. That is, the initial voltage at the starting of the constant current measurement is the same as the initial voltage at the starting of the natural discharge measurement. Therefore, a second term on a right side of Equation (9) is different from that of Equation (4), but Equation (10) and Equation (5) are the same.

By solving the following simultaneous equations, the resistance value Rleak of the leakage resistance and the capacitance value Ctotal of the capacitor 140 when there is an interval between the first period and the second period can be calculated more accurately:

$$Ctotal=-dt2/(Rleak \times \ln\{1-dV2/(V0+Rleak \times Iconst)\})$$

$$Ctotal=-dt1/(Rleak \times \ln\{1-dV1/V0\})$$

When the above simultaneous equations are solved, the following equations are obtained:

$$Rleak=dV2/(Iconst \times \{1-(1-dV1/V0)^{dt2/dt1}\})-V0/Iconst$$

$$Ctotal=-dt1/(Rleak \times \ln\{1-dV1/V0\})$$

According to the modified embodiment, the initial voltage of the constant current measurement can be made higher than that when the first and second periods are set back-to-back. This allows both the first and second periods to be set longer. Accordingly, the measurement accuracy can be further improved.

On the other hand, when the first and second periods are set back-to-back, the overall measurement time can be shorter than that in the modified embodiment. Therefore, the stop time of the nonvolatile semiconductor memory 120 can be shortened.

Second Embodiment

In the memory system 1 shown in FIG. 1 according to the first embodiment, the terminal voltage Vcap of the capacitor 140 is measured by the power management circuit 130 that includes the measurement circuit 20. In other examples, the terminal voltage of the capacitor 140 may be measured without using the power management circuit 130. For example, an analog-to-digital converter may be built in the controller 110 and used in place of the measurement circuit 20.

Figure 11:
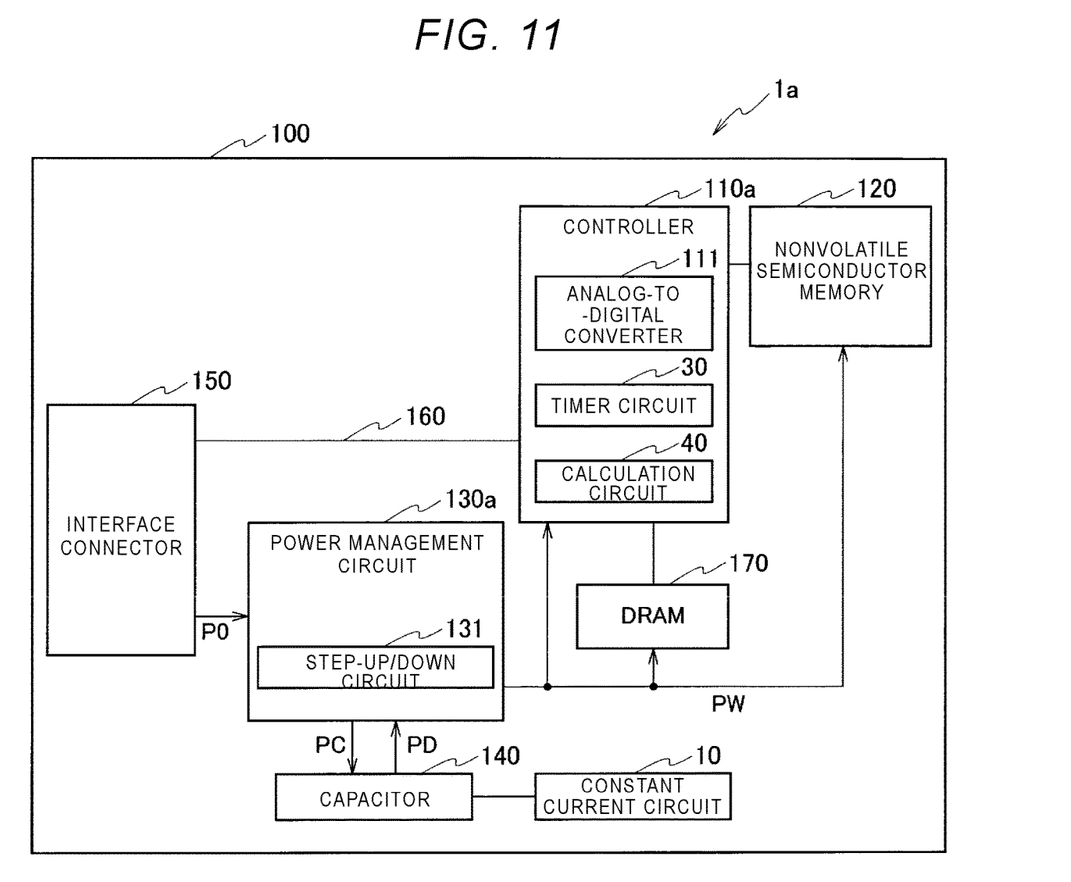
FIG. 11 depicts an example configuration of a memory system in a schematic view according to a second embodiment.

FIG. 11 depicts an example configuration of a memory system 1a according to a second embodiment. The memory system 1a includes a controller 110a, which includes an analog-to-digital converter 111 that functions similarly to the measurement circuit 20 of the first embodiment. The controller 110a also includes the timer circuit 30 built therein. The memory system 1a includes a constant current circuit 10 that is not built in power management circuit 130a. In a similar manner to the power management circuit 130 of the memory system 1 of the first embodiment, the power management circuit 130a in the memory system 1a of the second embodiment steps up the voltage of the external power P0 by the step-up/down circuit 131 to charge the capacitor 140.

Figure 12:
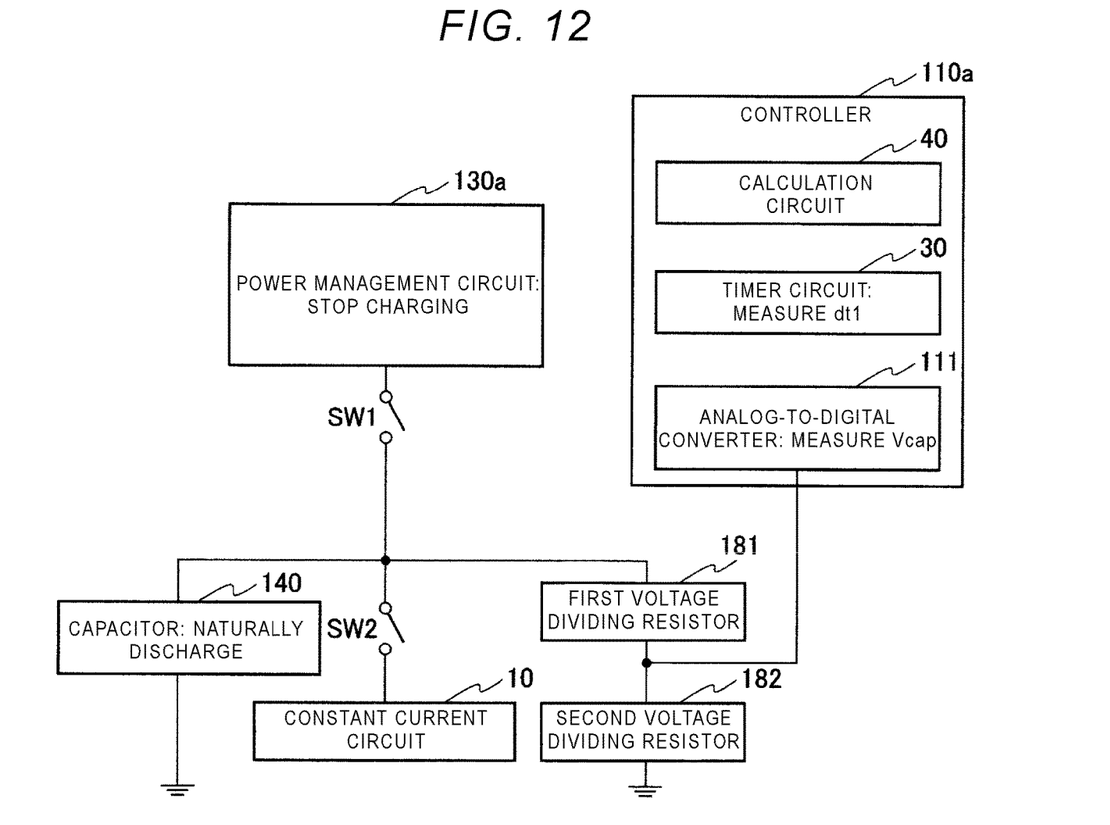
FIG. 12 is a block diagram depicting aspects related to a natural discharge measurement performed by a memory system according to a second embodiment.
Figure 13:
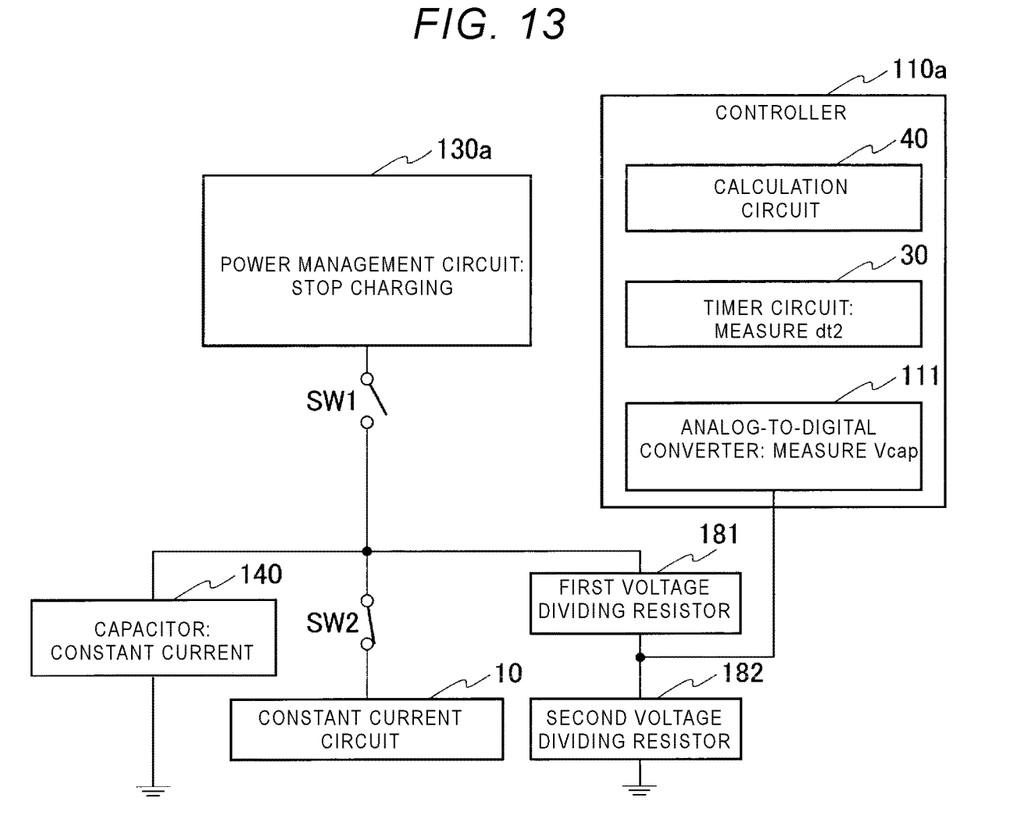
FIG. 13 is a block diagram depicting aspects related to a constant current measurement performed by a memory system according to a second embodiment.

In the memory system 1a, the capacitance value of the capacitor 140 can be measured by combining the natural discharge measurement with the constant current measurement. A method for measuring the capacitance value of the capacitor 140 using the memory system 1a will be described below with reference to FIG. 12 showing the natural discharge measurement and FIG. 13 showing the constant current measurement. FIG. 12 depicts an example configuration of the memory system 1a for performing the natural discharge measurement according to the second embodiment. FIG. 13 depicts an example configuration of the memory system 1a for performing the constant current measurement according to the second embodiment.

As shown in FIGS. 12 and 13, a first voltage dividing resistor 181 and a second voltage dividing resistor 182 that are connected in series with each other are connected in parallel with the capacitor 140. As a result, in the memory system 1a, the voltage supplied to the capacitor 140 is divided by the first voltage dividing resistor 181 connected to one terminal of the capacitor 140 and the second voltage dividing resistor 182 connected to a wiring which becomes a GND potential. The analog-to-digital converter 111 of the controller 110a measures a voltage at a connection point between the first voltage dividing resistor 181 and the second voltage dividing resistor 182 as a voltage corresponding to the terminal voltage Vcap. The terminal voltage Vcap of the capacitor 140 is divided because the voltage of the external power P0 is stepped up by the step-up/down circuit 131 of the power management circuit 130a to charge the capacitor 140 and the terminal voltage Vcap of the capacitor 140 cannot be input to the controller 110a. That is, when the voltage supplied to the capacitor 140 is larger than a withstand voltage of the analog-to-digital converter 111, the terminal voltage Vcap of the capacitor 140 is divided so that the analog-to-digital converter 111 is not damaged.

In the natural discharge measurement (see FIG. 12), a switch SW1 is turned off (opened) to stop the power management circuit 130a from charging the capacitor 140. A switch SW2 is turned off (opened) to stop the constant current circuit 10 from extracting charge from the capacitor 140. Turn-on/off of the switch SW1 and the switch SW2 may be controlled by the controller 110a.

In this state, the analog-to-digital converter 111 measures the terminal voltage Vcap as an initial voltage at the start of the natural discharge measurement drops by the first differential voltage dV1. The timer circuit 30 measures a first elapsed time dt1 from the start of the measurement to when the initial terminal voltage Vcap drops by the first differential voltage dV1.

In the constant current measurement (see FIG. 13), the switch SW1 is turned off (opened) to stop the power management circuit 130a from charging the capacitor 140. The switch SW2 is turned on (closed) to start extracting charge from the capacitor 140 using the constant current circuit 10. The analog-to-digital converter 111 then measures the terminal voltage Vcap of the capacitor 140 while the constant current circuit 10 extracts the charge from the capacitor 140 at the constant current.

That is, the analog-to-digital converter 111 measures the terminal voltage Vcap as an initial voltage at the start of the constant current measurement drops by the second differential voltage dV2. The timer circuit 30 measures the second elapsed time dt2 from the start of the measurement to when the initial terminal voltage Vcap drops by the second differential voltage dV2.

Thereafter, the calculation circuit 40 calculates the capacitance value of the capacitor 140 and the resistance value of the leakage resistance by using the first differential voltage dV1, the second differential voltage dV2, the first elapsed time dt1, and the second elapsed time dt2.

In the memory system 1a according to the second embodiment, an analog-to-digital converter 111 built in the controller 110a is used for measuring the terminal voltage of the capacitor 140. Therefore, the configuration of the power management circuit 130a can be simplified. Other aspects of the second embodiment are substantially the same as the memory system 1 of the first embodiment, and description of these repeated aspects will be omitted.

A field effect transistor (FET) may be used as the switch SW1 and/or the switch SW2. A relay may instead be used, although a response speed of the relay switch might be slower than that of the FET switch.

Figure 14:
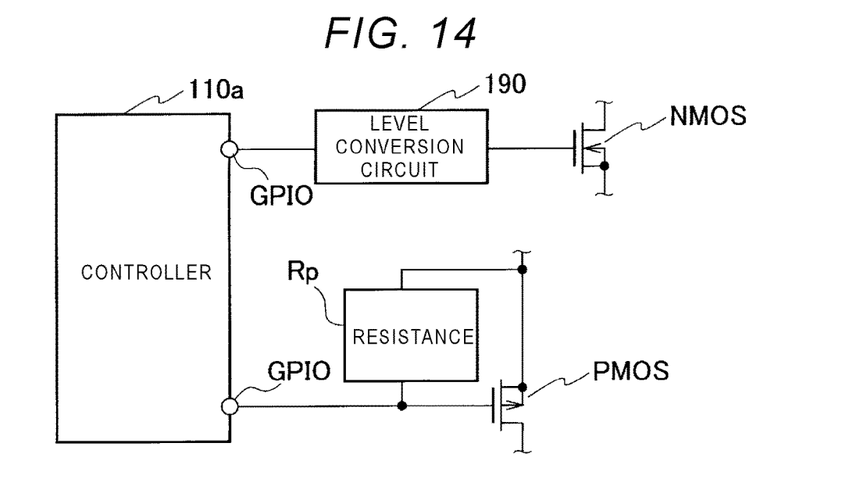
FIG. 14 is a schematic configuration example of a switch.

A general-purpose input/output (GPIO) pin may be mounted on the controller 110a (such as with a controller which is a component of an SSD) as a general-purpose input/output pin. The GPIO pin can output high level, low level, and high impedance level signals. The on/off switching of the switches SW1 and SW2 can be controlled with the signals supplied via the GPIO pin. For example, as shown in FIG. 14, when an n-channel MOS transistor NMOS connected to the GPIO pin is used for the switching, a level conversion circuit 190 is provided between the GPIO pin and the NMOS to transmit the GPIO pin signals to the NMOS. In a case where a p-channel type MOS transistor PMOS connected to the GPIO pin is used for one of or both of the switches SW1 and SW2, a resistance Rp is provided as shown in FIG. 14, and the combination of the PMOS and the resistance Rp constitutes the switch.

Other Embodiments

The memory system 1 is not limited to an SSD or a UFS device. Furthermore, while the case where the capacitor 140 is a capacitor for a PLP process was described above, measurement methods according to the present disclosure may be applied to the measurement of the capacitance values of capacitors other than related to the PLP process. For example, a capacitance value of a bypass capacitor mounted on the memory system 1 as a countermeasure against power supply noise can be measured by a measurement method according to the present disclosure.

While certain embodiments have been described, these embodiments have been presented by way of example only and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system, comprising:
a nonvolatile semiconductor memory;
a capacitor configured to store charge to be supplied to the nonvolatile semiconductor memory;
a constant current circuit configured to extract charge from the capacitor at a constant current;
a measurement circuit configured to measure a terminal voltage of the capacitor; and
a controller configured to:
control the nonvolatile semiconductor memory; and
calculate a capacitance value of the capacitor based on a resistance value of a leakage resistance through which a leakage current of the capacitor flows and a change in the measured terminal voltage over time in a first period during which the capacitor naturally discharges and a second period during which the constant current circuit extracts charge from the capacitor.

2. The memory system according to claim 1, wherein the measurement circuit is configured to measure:
the terminal voltage from a start of a first measurement until the terminal voltage drops by a first differential voltage during the first period; and
the terminal voltage from a start of a second measurement until the terminal voltage drops by a second differential voltage during the second period.

3. The memory system according to claim 2, further comprising:
a timer circuit configured to measure:
a first elapsed time from the start of the first measurement until the terminal voltage drops by the first differential voltage; and
a second elapsed time from the start of the second measurement until the terminal voltage drops by the second differential voltage.

4. The memory system according to claim 3, wherein the controller calculates the capacitance value of the capacitor and the resistance value of the leakage resistance based on the first differential voltage, the second differential voltage, the first elapsed time, and the second elapsed time.

5. The memory system according to claim 1, wherein the first and second periods are continuous with each other.

6. The memory system according to claim 1, further comprising:
a power management circuit configured to:
control power supply to the nonvolatile semiconductor memory and the controller; and
supply charge stored in the capacitor to the nonvolatile semiconductor memory and the controller.

7. The memory system according to claim 6, wherein the power management circuit is further configured to control charging and discharging of the capacitor.

8. The memory system according to claim 6, wherein the constant current circuit and the measurement circuit are incorporated in the power management circuit.

9. The memory system according to claim 1, wherein the measurement circuit is incorporated in the controller.

10. The memory system according to claim 9, wherein the measurement circuit comprises an analog-to-digital converter.

11. The memory system according to claim 1, wherein the nonvolatile semiconductor memory is a NAND flash memory.

12. A memory system, comprising:
a nonvolatile semiconductor memory;
a capacitor configured to store charge to be supplied to the nonvolatile semiconductor memory;
a constant current circuit configured to extract the charge from the capacitor at a constant current; and
a controller configured to calculate a capacitance value of the capacitor and a resistance value of a leakage resistance through which a leakage current of the capacitor flows, based on:
a terminal voltage of the capacitor;
a first differential voltage and a first elapsed time in a first period during which a natural discharge measurement is performed; and
a second differential voltage and a second elapsed time in a second period during which a constant current measurement is performed, wherein
the terminal voltage is measured from a start of the natural discharge measurement until the terminal voltage drops by the first differential voltage and from a start of the constant current measurement until the terminal voltage drops by the second differential voltage, and
the first elapsed time is measured from the start of the natural discharge measurement until the terminal voltage drops by the first differential voltage and the second elapsed time is measured from the start of the constant current measurement until the terminal voltage drops by the second differential voltage.

13. The memory system according to claim 12, wherein the first and second periods are continuous with each other.

14. The memory system according to claim 12, wherein an interval period is between the first and second periods and the terminal voltage at the start of the first period is equal to the terminal voltage at the start of the second period.

15. The memory system according to claim 12, further comprising:
   a measurement circuit configured to measure the terminal voltage; and
   a timer circuit configured to measure the first and second elapsed times.

16. A method for measuring a capacitance value for a capacitor of a memory system, the method comprising:
   measuring terminal voltages of the capacitor in a first period during which the capacitor naturally discharges and a second period during which charge is extracted from the capacitor at a constant current;
   measuring a first time required for the terminal voltage to drop by a first amount from an initial value at a start of the first period;
   measuring a second time required for the terminal voltage to drop by a second amount from an initial value at a start of the second period; and
   calculating a capacitance value of the capacitor based on the measured first time, the measured second time, the first drop amount, and the second drop amount by using a formula including a resistance value of a leakage resistance through which a leakage current of the capacitor flows as a variable in each of the first period and the second period.

17. The method according to claim 16, wherein the first and second periods are continuous with each other.

18. The method according to claim 16, wherein an interval period is between the first and second periods and the terminal voltage at the start of the first period is equal to the terminal voltage at the start of the second period.

19. The method according to claim 16, wherein
   the memory system comprises a nonvolatile memory, and
   the capacitor is for supplying power to the nonvolatile memory when external power is cutoff.

20. The method according to claim 19, further comprising:
   shifting the memory system to an operating mode preventing further write operations to the nonvolatile memory when the calculated capacitance value is less than a certain value.

* * * * *